United States Patent
Stockmeier et al.

(10) Patent No.: US 10,819,930 B2
(45) Date of Patent: *Oct. 27, 2020

(54) METHOD OF OPERATING A SEMICONDUCTOR IMAGE SENSOR WITH INTEGRATED PIXEL HEATING

(71) Applicant: ams AG, Unterpremstaetten (AT)

(72) Inventors: Thomas Stockmeier, Unterpremstaetten (AT); Richard Forsyth, Mantscha (AT); Thomas Troxler, Erlenbach (CH)

(73) Assignee: ams AG, Unterpremstaetten (AT)

( * ) Notice: Subject to any disclaimer, the term of this patent is extended or adjusted under 35 U.S.C. 154(b) by 66 days.

This patent is subject to a terminal disclaimer.

(21) Appl. No.: 16/171,845

(22) Filed: Oct. 26, 2018

(65) Prior Publication Data

US 2019/0068907 A1   Feb. 28, 2019

Related U.S. Application Data

(63) Continuation of application No. 15/313,088, filed as application No. PCT/EP2015/061306 on May 21, 2015, now Pat. No. 10,154,215.

(30) Foreign Application Priority Data

May 28, 2014  (EP) .................... 14170387
Jun. 25, 2014  (EP) .................... 14173903

(51) Int. Cl.
*H04N 5/335*   (2011.01)
*H04N 5/3745*  (2011.01)
*H04N 5/365*   (2011.01)
*H01L 23/34*   (2006.01)
*H01L 27/146*  (2006.01)
*H04N 5/378*   (2011.01)

(52) U.S. Cl.
CPC ........ *H04N 5/3745* (2013.01); *H01L 23/345* (2013.01); *H01L 27/14643* (2013.01); *H04N 5/3651* (2013.01); *H04N 5/378* (2013.01)

(58) Field of Classification Search
CPC .... H04N 5/3745; H04N 5/3651; H04N 5/378; H01L 23/345
USPC ........................................... 348/308
See application file for complete search history.

(56) References Cited

U.S. PATENT DOCUMENTS

| | | |
|---|---|---|
| 4,808,009 A | 2/1989 | Sittler et al. |
| 6,046,433 A | 4/2000 | Gross et al. |
| 6,133,572 A | 10/2000 | Cunningham |
| 7,480,006 B1 | 1/2009 | Frank |
| 2006/0055800 A1 | 3/2006 | Ackland et al. |
| 2007/0138395 A1 | 6/2007 | Lane et al. |
| 2008/0073488 A1* | 3/2008 | Silsby ............ H04N 3/155 250/208.1 |

(Continued)

FOREIGN PATENT DOCUMENTS

| | | |
|---|---|---|
| JP | 2008-524621 A | 7/2008 |
| JP | 2008-543096 A | 11/2008 |

(Continued)

*Primary Examiner* — Usman A Khan
(74) *Attorney, Agent, or Firm* — Fish & Richardson P.C.

(57) ABSTRACT

At least one of the pixels of the image sensor is heated using at least one heater, and the temperature of this pixel is thus increased by a larger degree than the temperature of at least a further one of the pixels.

5 Claims, 2 Drawing Sheets

(56) References Cited

U.S. PATENT DOCUMENTS

| | | | |
|---|---|---|---|
| 2009/0140149 A1* | 6/2009 | Tinnes | ................... G01J 5/04 250/352 |
| 2010/0193893 A1 | 8/2010 | Meinhardt et al. | |
| 2011/0180710 A1 | 7/2011 | Bluzer | |

FOREIGN PATENT DOCUMENTS

| | | |
|---|---|---|
| JP | 2010-507083 A | 3/2010 |
| JP | 2013-041921 A | 2/2013 |
| WO | 2005/015637 | 2/2005 |
| WO | 2006/131209 | 12/2006 |
| WO | 2008/036289 | 3/2008 |

* cited by examiner

METHOD OF OPERATING A SEMICONDUCTOR IMAGE SENSOR WITH INTEGRATED PIXEL HEATING

CROSS-REFERENCE TO RELATED APPLICATION(S)

This application is the National Stage of International Application No. PCT/EP2015/061306, filed on May 21, 2015, and claims the benefit of European Application No. 14173903.7, filed on Jun. 25, 2014 and European Application No. 14170387.6, filed on May 28, 2014. The disclosures of the prior applications are incorporated herein by reference.

BACKGROUND

Pictures produced by a semiconductor image sensor may show slight non-uniformities from pixel to pixel, which can be caused by local temperature differences in the sensor chip, because leakage current and responsivity of a photodiode depend on the temperature. To avoid this problem, image sensor chips are preferably operated at a constant, spatially homogeneous temperature. Usual methods of maintaining a spatially and temporally constant temperature, especially by heating or cooling the whole image sensor chip, may not be appropriate to obtain optimal temperature conditions, especially if photo sensors are integrated in the vicinity of components generating heat.

SUMMARY

The semiconductor image sensor comprises a plurality of pixels, which are each provided with a photo sensor, and at least one heater, which is integrated with the photo sensors and is arranged in at least one of the pixels or in the vicinity of at least one of the pixels. At least one integrated readout circuit may also be integrated. An appropriate operation of the heater will increase the temperature of the photo sensor of the relevant pixel. The temperatures of the other photo sensors may be increased by a smaller degree or not affected by the heating.

In the method of operating such a semiconductor image sensor, the at least one of the pixels is heated with the heater, so that the temperature of this pixel is increased by a larger degree than the temperature of at least a further one of the pixels. Some or all of the further pixels may essentially not be affected by the heating process. In particular, heating the pixel aims at a local compensation of a temperature difference that is due to an operation of the integrated readout circuit and/or further integrated readout circuits.

In a variant of the method, the temperature is locally controlled by at least one integrated temperature sensor.

The following is a detailed description of examples of the image sensor and the method of operating such an image sensor in conjunction with the appended figures.

DETAILED DESCRIPTION

Figure 1:
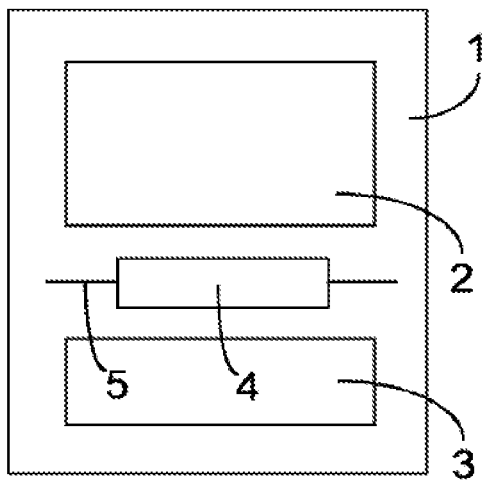
FIG. 1 schematically shows the arrangement of the photo sensor, heater and readout circuit in a pixel of an image sensor.

FIG. 1 shows a pixel 1 of the semiconductor image sensor. The pixel 1 comprises a photo sensor 2, which is integrated in a semiconductor body or substrate. The details of the photo sensor 2, which may especially be a photodiode or a cluster of photodiodes, for instance, are not essential and are therefore not shown in FIG. 1. A readout circuit 3 may optionally be integrated in the semiconductor body or substrate together with the photo sensor 2. The readout circuit 3 may be a CMOS circuit, for instance. Each pixel 1 may be provided with an individual readout circuit 3. Instead, a readout circuit 3 may be provided for some or all of the photo sensors 2 in common. The photo sensor 2 and the readout circuit 3 may be integrated within the pixel 1 on the same side of the semiconductor body or substrate, but the arrangement of the photo sensor 2 and the readout circuit 3 can differ from this example.

A heater 4 is integrated in the pixel 1 or in the vicinity of the pixel 1. The heater 4 may especially be a resistive heater and is optionally provided with electric connections 5 for an application of a voltage or electric current. Resistive heaters are known per se in semiconductor technology. In the device according to FIG. 1, the heater 4 is arranged between the photo sensor 2 and the readout circuit 3. An arrangement of the heater 4 in the vicinity of the readout circuit 3, like the arrangement shown in FIG. 1, may be especially suitable, because such an arrangement allows to substitute or supplement the generation of heat by the readout circuit 3 with a similar generation of heat by the heater 4, especially during a mode of operation of the image sensor in which the readout circuit 3 does not generate the maximal or usual amount of heat. Thus a homogeneous temperature distribution can be maintained during every mode of operation of the image sensor.

The heater 4 can be integrated in the image sensor by placing a resistor or a set of resistors close to the photo sensor 2.

The resistor or set of resistors can particularly be formed by a layer of electrically resistive material in a way that is known per se in semiconductor technology. Several individual heating elements formed by resistors may be connected in parallel or in series to form the heater 4. A voltage or electric current is applied to the electric connections 5 in order to generate heat in the resistor or set of resistors. The voltage or current supply can be provided directly on the image sensor chip or externally via electric terminals of the image sensor chip. The heaters 4 of copies of the image sensor may be connected to one another via interconnections between the chips.

Figure 2:
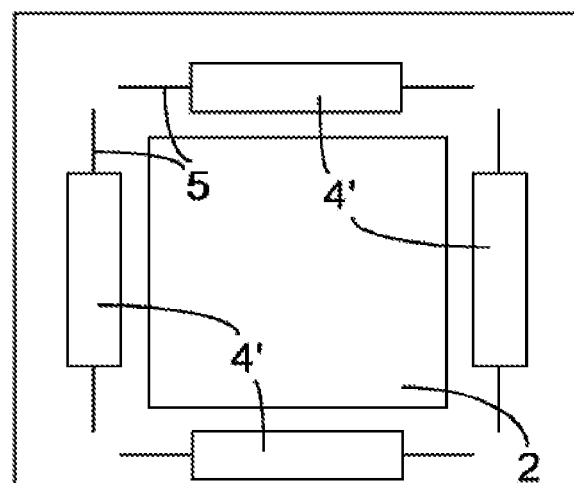
FIG. 2 shows an arrangement according to FIG. 1 for an image sensor comprising a plurality of individual heaters surrounding the photo sensor.

FIG. 2 shows a pixel 1 of a further semiconductor image sensor. Elements of the image sensor according to FIG. 2 that correspond to elements of the image sensor according to FIG. 1 are designated with the same reference numerals. In the image sensor according to FIG. 2, the heater 4 comprises several individual heaters 4', which may be provided with separate electric connections 5. The individual heaters 4' may especially surround the photo sensor 2, as shown in FIG. 2 by way of an example, but the arrangement of the photo sensor 2 and the individual heaters 4' can differ from this example.

Figure 3:
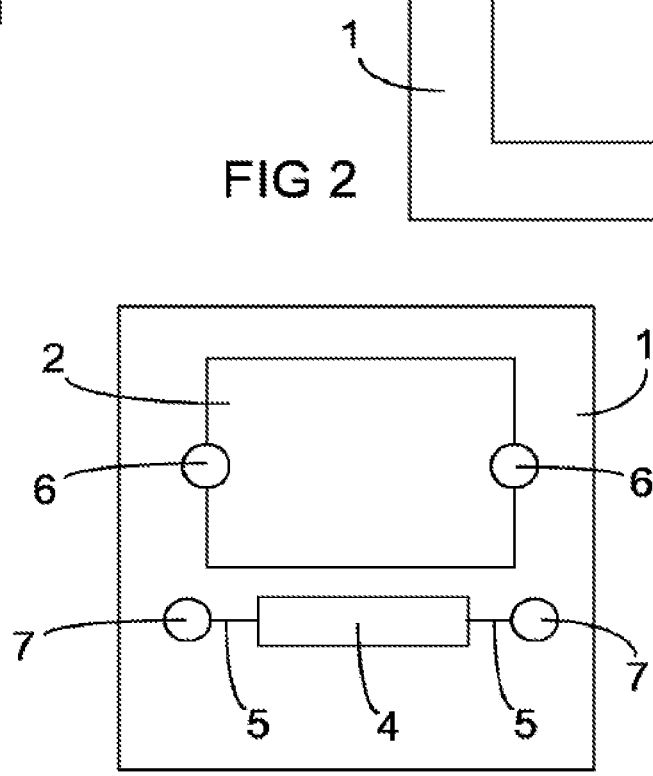
FIG. 3 shows an arrangement according to FIG. 1 for an image sensor with through-substrate vias.

FIG. 3 shows a pixel 1 of a further semiconductor image sensor. Elements of the image sensor according to FIG. 3 that correspond to elements of the image sensor according to FIGS. 1 and 2 are designated with the same reference numerals. The image sensor according to FIG. 3 comprises through-substrate vias 6, 7 for an electric connection of the photo sensor 2 and the heater 4. This arrangement is especially suitable if the readout circuit 3 is arranged on the side of the semiconductor body or substrate that is opposite the photo sensor 2. The heater 4 may also be arranged on the opposite side, especially in a location under the photo sensor 2, and in this case it may be sufficient to provide only the photo sensor 2 with through-substrate vias 6 for electric connection.

Figure 4:
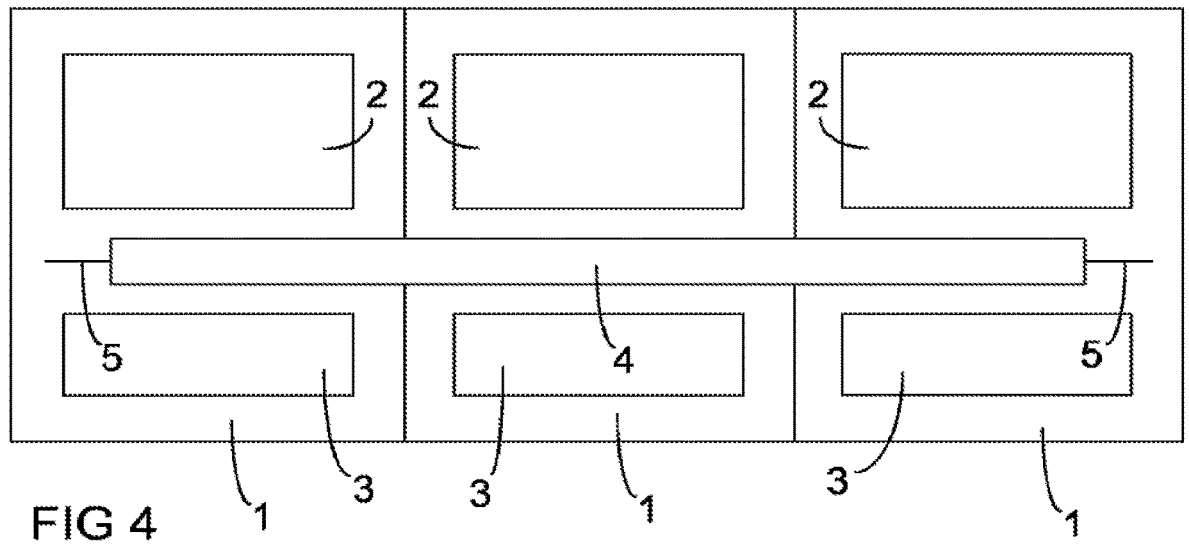
FIG. 4 shows a group of pixels with a heater arranged close to this group of pixels.

FIG. 4 shows an array of three neighboring pixels 1 of a further semiconductor image sensor. Elements of the image sensor according to FIG. 4 that correspond to elements of the image sensor according to FIG. 1 are designated with the same reference numerals. The image sensor according to FIG. 4 comprises a heater 4 arranged close to several pixels 1 in common. In the example shown in FIG. 4, the heater 4 is arranged between the photo sensors 2 and the readout circuits 3 of these pixels 1. The heater 4 may be arranged in the vicinity of any number of pixels 1 in common, and the arrangement may differ from the example shown in FIG. 4.

Figure 5:
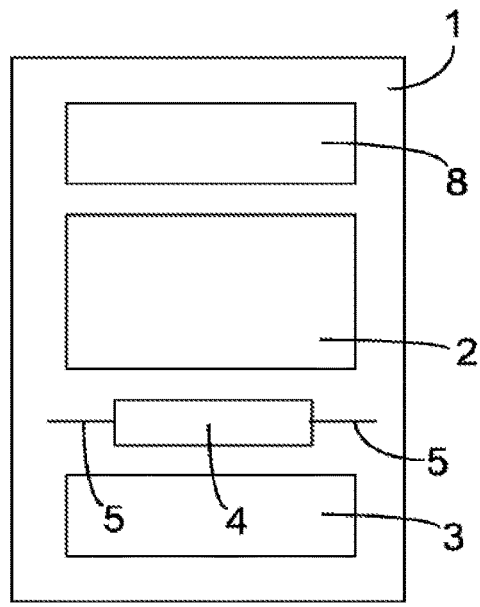
FIG. 5 shows an arrangement according to FIG. 1 for an image sensor comprising a temperature sensor.

FIG. 5 shows a pixel 1 of a further semiconductor image sensor. Elements of the image sensor according to FIG. 5 that correspond to elements of the image sensor according to FIG. 1 are designated with the same reference numerals. The image sensor according to FIG. 5 further comprises a temperature sensor 8, which may be arranged close to the photo sensor 2. The temperature sensor 8 serves to detect the temperature of the photo sensor 2, so that the heater 4 can be operated under control of the temperature sensor 8 in order to avoid deviations of the desired temperature. Similarly to the use of the heater 4 for several pixels 1 in common, according to FIG. 4, the temperature sensor 8 may be used for a group of pixels 1 in common. Instead, each pixel 1 may be provided with an individual temperature sensor 8. The evaluation of the measurement of the temperature and the control of the corresponding operation of the heater 4 may be implemented in the readout circuit 3, for instance.

By integrating the heater 4 or an array of heaters 4 each provided for one pixel 1 or for a small group of pixels 1 into the image sensor chip, the effort for the assembly and/or housing of the image sensor chip are substantially reduced. The integrated heater 4 or heaters 4 allow to heat different areas of the image sensor chip, in particular different pixels 1 or groups of pixels 1, independently of one another and thus to maintain a temperature distribution of the image sensor chip that is spatially and temporally essentially constant. The image production is thereby improved and non-uniformities can be avoided or at least substantially reduced.

LEGEND 1 pixel
2 photo sensor
3 readout circuit
4 heater
4' individual heater
5 electric connection
6 through-substrate via
7 through-substrate via

What is claimed is:

1. A method of operating a semiconductor image sensor comprising a plurality of pixels, each of the pixels comprising a respective photo sensor, the method comprising:
   heating at least one of the pixels using at least one heater integrated with the photo sensors, wherein the at least one heater is arranged in the at least one of the pixels or in a vicinity of the at least one of the pixels,
   wherein heating the at least one of the pixels comprises:
      increasing a temperature of the at least one of the pixels by a larger degree than a temperature of at least a further one of the pixels, and
      substituting or supplementing a generation of heat by at least one integrated readout circuit of the semiconductor image sensor.

2. The method of claim 1, wherein heating the at least one of the pixels comprises locally compensating a temperature difference that is due to an operation of at least one integrated readout circuit and/or further integrated readout circuits.

3. The method of claim 1 further comprising:
   controlling the temperatures of the at least one of the pixels and the further one of the pixels locally based on measurements obtained by at least one integrated temperature sensor.

4. The method of claim 2 further comprising:
   controlling the temperatures of the at least one of the pixels and the further one of the pixels locally based on measurements obtained by at least one integrated temperature sensor.

5. A method of operating a semiconductor image sensor comprising a plurality of pixels, each of the pixels comprising a respective photo sensor, the method comprising:
   heating at least one of the pixels using at least one heater integrated with the photo sensors, wherein the at least one heater is arranged in the at least one of the pixels or in a vicinity of the at least one of the pixels,
   wherein heating the at least one of the pixels comprises:
      increasing a temperature of the at least one of the pixels by a larger degree than a temperature of at least a further one of the pixels, and
      reducing a local difference between temperatures of the pixels, wherein the local difference is caused by an operation of at least one integrated readout circuit of the semiconductor image sensor.

* * * * *